United States Patent
Sriram et al.

(10) Patent No.: US 7,223,705 B2
(45) Date of Patent: May 29, 2007

(54) AMBIENT GAS TREATMENT OF POROUS DIELECTRIC

(75) Inventors: Mandyam A. Sriram, Beaverton, OR (US); Jennifer O'Loughlin, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 23 days.

(21) Appl. No.: 10/429,984

(22) Filed: May 6, 2003

(65) Prior Publication Data
US 2004/0224536 A1    Nov. 11, 2004

(51) Int. Cl.
*H01L 21/31*    (2006.01)
*H01L 21/469*   (2006.01)

(52) U.S. Cl. ............... 438/781; 438/787; 257/E21.241; 257/E21.273; 257/E21.293

(58) Field of Classification Search ................ 438/781, 438/787, 795
See application file for complete search history.

(56) References Cited

U.S. PATENT DOCUMENTS 6,346,490 B1 *  2/2002 Catabay et al. ............. 438/795
6,486,061 B1 * 11/2002 Xia et al. .................... 438/680

* cited by examiner

*Primary Examiner*—Alexander Ghyka
(74) *Attorney, Agent, or Firm*—Blakely, Sokoloff, Taylor & Zafman LLP

(57) ABSTRACT

A method of modifying the porosity of a thickness of a layer of porous dielectric material having a surface and formed on a semiconductor substrate is provided by exposing the porous dielectric material to a sufficient temperature in the presence of a first gas to drive moisture particles out of the pores. Modifying also includes, exposing the porous dielectric material to a radio frequency stimulus of sufficient power in the presence of a second gas to densify a thickness of the porous dielectric material to reduce or prohibit subsequent absorption of moisture or reactant gas particles by the thickness or porous dielectric material.

21 Claims, 3 Drawing Sheets

AMBIENT GAS TREATMENT OF POROUS DIELECTRIC

FIELD

Embodiments related to integrated circuit processing and, more particularly, to the treatment of dielectric material during fabrication of an integrated circuit.

BACKGROUND

Modern integrated circuits (ICs) use dielectric layers to isolate the individual devices on a chip from conductive interconnections connected to the individual devices to integrate devices and send and receive signals external to the chip. Popular types of representative dielectric materials include silicon dioxide ($SiO_2$), silicon nitride ($Si_3N_4$), phosphosilicate glass (PSG), silicon carbide (SiC), fluorinated silicate glass (FSG), carbon doped oxide (CDO), and cubic boron nitride (CBN). For instance, a dielectric layer of the representative dielectric materials above may be formed at one or more layers of an integrated circuit during integrated circuit fabrication.

The dielectric constant of a dielectric material generally describes the parasitic capacitance of the material. As the parasitic capacitance is reduced, the cross-talk (e.g., a characterization of the electric field between adjacent interconnections, such as aluminum alloy or copper interconnections formed in trenches along the dielectric) is reduced, as is the resistance-capacitance (RC) time delay and power consumption (e.g., with respect to signals conducted along such interconnections).

The dielectric constant of a dielectric material can be substantially effected by water or liquid absorbed in the pores of the dielectric material. Thus, the porosity of the dielectric material, and amount of moisture in those pores can cause a significant increase in the dielectric constant. The porosity of dielectric material is defined as the percent of the volume of dielectric material that is pore space or, in other words, as the ratio of the volume of all the pores in the dielectric material to the volume of the whole dielectric material.

BRIEF DESCRIPTION OF THE DRAWINGS

The features, aspects, and advantages of the invention will become more thoroughly apparent from the following detailed description, appended claims, and accompanying drawings in which:

DETAILED DESCRIPTION

Figure 1:
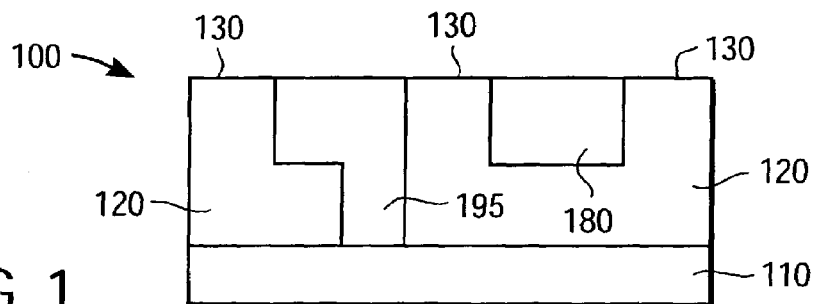
FIG. 1 is a schematic side view of a portion of a circuit substrate or interconnect layer on a substrate including a contact and interconnect formed in a dielectric layer.

FIG. 1 is a schematic side view of a portion of a circuit substrate or interconnect layer on a substrate including a contact and interconnect formed in a dielectric layer. Structure 100 includes semiconductor substrate 110 of, for example, a semiconductor material such as silicon or a semiconductor layer on an insulator such as glass. Overlying semiconductor substrate 110 is layer of dielectric material 120 (e.g., a dielectric material having a porosity value) having surfaces 130. In addition, formed within dielectric material 120 are contact 195 and interconnect 180. In one embodiment, contact 195 is a portion of an interconnect line (e.g., a metal trench, such as interconnect 180) and connects to a contact point on a surface of semiconductor substrate 110. For instance, semiconductor substrate 110 may contain a plurality of integrated circuit devices or underlying interconnections for contact 195 to connect to (e.g., such as a gate, a junction, an interconnect and a multi-level interconnection device configuration, etc.). (See devices 610 and 615 of FIG. 6 below.) Contact 195 and/or interconnect 180 may include one or more appropriate conductors, such as copper (Cu), aluminum (Al), and/or various other appropriate metals and/or conductors.

In one embodiment, dielectric material 120 may include suitable porous or polymer dielectric, interlayer dielectric (ILD), and/or PMD materials, such as, silicon dioxide ($SiO_2$), silicon nitride ($Si_3N_4$), phosphosilicate glass (PSG), silicon carbide (SiC), fluorinated silicate glass (FSG), carbon doped oxide (CDO) or other appropriate ceramic dielectric material, hydrogen silsesquioxane (HSQ), methyl silsesquioxane (MSQ), polymer dielectric material (e.g., such as that sold under the trademark "SiLK"), cubic boron nitride (CBN), and/or aerogel. Dielectric material 120, may be deposited, such as by a chemical vapor deposition (CVD) process or by a spin-on process, to a thickness on the order of approximately 700 nanometers or various other appropriate thicknesses depending on the current technology. For example, the thickness of dielectric material 120 may depend, on part, on size characteristics and scaling considerations for one or more devices (e.g., as described with respect to contact 195 above and devices 610 and 615 of FIG. 6 below) formed in substrate 110.

In embodiments, surfaces 130 and the corresponding surface of contact 195 (e.g., see 290, FIG. 2) and corresponding surface of interconnect 180 (e.g., see 280, FIG. 2) may form a generally planar surface, such as one resulting from planarization polishing (e.g., including by chemical-mechanical polishing (CMP)), and/or cleaning.

In fabricating ICs, "backend" or wiring level ILD materials (e.g., PMD materials) having low dielectric constants may include carbon doped oxide (CDO) having nominally zero porosity (e.g., and thus having a dielectric constant in the range of 2.9 to 3.1). CDO or other materials with increased porosity may be used to achieve dielectric constant values below 2.8. However, the integration of porous material as a dielectric material poses significant challenges since various processes used to pattern dielectrics and subsequent processing operations use water or contain water vapor, which when absorbed in the porous dielectric films (e.g., such as dielectric material 120) causes an increase in the dielectric constant. Nevertheless, such challenges can be met by driving the moisture away from the dielectric (e.g., CDO) after completion of aqueous processing (e.g., such as copper interconnect and contact polishing and cleaning) and then densifying or sealing the top surface of the dielectric material after the moisture is driven away and prior to exposure of the dielectric material to subsequent moisture, reactive gases, or liquids. One way is by using an etch stop tool to drive away the moisture and seal the top surface of the dielectric. Moreover, the driving away of moisture and densifying or sealing of the top surface of the dielectric material can include a thickness of sufficiently densified dielectric material to reduce, slow, or prevent absorption of a reactant gas by the densified dielectric material, such as when an IC fabrication chamber containing an integrated circuit having the densified dielectric material is populated with moisture or water particles, or is flooded with reactant gases (e.g., such as $NH_3$) during an etch stop deposition process.

Figure 2:
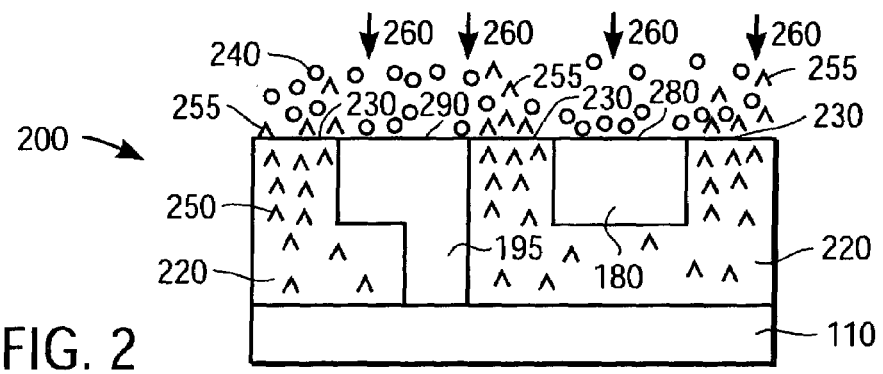
FIG. 2 shows the structure of FIG. 1 during exposure to a first ambient of gas.

FIG. 2 shows the structure of FIG. 1 during exposure of surfaces 130 and the corresponding surface of contact 195 and interconnect 180 to a first ambient of gas. Dielectric material 120 is exposed to first ambient of gas 240, such as by flooding an IC fabrication chamber containing a substrate (e.g., wafer) having structure 100 with first ambient of gas 240 and allowing the gas to interact with surfaces 130, as well as corresponding contact surface 290 of contact 195 and corresponding interconnect surface 280 of interconnect 180, as shown in FIG. 2. Exposure to the ambient and associated exposure conditions are selected to modify the porosity of dielectric material 120 and form dielectric material 220, a material layer having a modified (e.g., higher) porosity than dielectric material 120 of FIG. 1. Modification of dielectric material 120 may also include exposure to temperature 260 sufficient to drive away or evaporate a plurality of water, other moisture containing particles, and/or other gases or absorbed materials (e.g., other than $H_2O$) 250 that exist within the pores of porous dielectric material 120, and thus forms dielectric material 220. For example, a plurality of water or other moisture containing particles can be driven away by a first ambient of gas under first ambient exposure conditions adequate to cause particles of the first ambient of gas to push out or replace the water or other moisture containing particles from the pores of the porous dielectric material. Moreover, instances of driving away or evaporating a plurality of water or other moisture containing particles include, by exposure to a first ambient of gas under first ambient exposure conditions including heating the water or other moisture containing particles in the pores to a temperature that drives them out of the pores, or causes the particles to evaporate and exit out of the pores of porous dielectric material 120 (e.g., such as by floating out of surfaces 230 as water vapor gas particles), and thus forms dielectric material 220. For example, such driven out or evaporated water or moisture particles can be shown by driven out or evaporated particles 255.

According to an embodiment, dielectric material 120 of CDO may be treated by exposure to first ambient of gas 240 at temperature 260 greater than 150 degrees Celsius. Moreover, suitable gases for first ambient of gas 240 include inert gases, such as argon (Ar), nitrogen ($N_2$), and helium (He); as well as a carbon containing gas, such as one of an alkyl (e.g., such as C1 to C4 alkyl), an alkylene (C1 to C4 alkylene), carbon dioxide ($CO_2$), and hydrogen ($H_2$).

In addition, according to embodiments, first ambient exposure conditions for exposing dielectric material 120 (e.g., such as dielectric material 120 of CDO) to first ambient of gas 240 may include exposure for a time period, at a pressure level, and at a temperature sufficient to drive or evaporate enough water, or other moisture containing particles out of the dielectric material to reduce the dielectric constant of dielectric material 220 to a desired or selected level. Such a suitable time period includes a period in the range between one second and five minutes. However, other appropriate periods of time are contemplated. Such first ambient exposure conditions also comprises exposure at temperature 260 in the range between 250 degrees Celsius and 500 degrees Celsius, although other suitable temperatures are contemplated. Furthermore, such first ambient exposure conditions include exposure at a pressure (e.g., such as pressure provided by exposing structure 200 in a pressurized IC fabrication chamber) in the range of between 0 Torr and 10 Torr, as well as other suitable pressures (e.g., such as 5 Torr). Thus, dielectric material 120 of CDO may be exposed to first ambient of gas 240, such as argon, nitrogen or helium, at a temperature, for a time, and under sufficient pressure to drive or evaporate moisture from the pores of dielectric material 120, until the dielectric constant of dielectric material 120 is reduced to the desired level, and thus forms dielectric 220 and/or until "hillocks" form on conductor surfaces disposed within dielectric material 120 (e.g., such as formation of hillocks on contact surface 290 and/or interconnect surface 280). For instance, a dielectric layer of CDO may be exposed to a first ambient helium gas at a temperature of 430 degrees Celsius and at a pressure of 5 Torr for ten seconds. As a result, a porous dielectric material of CDO whose dielectric constant has been increased from 2.7 to 4.0 due to moisture absorption, a conductor material (e.g., copper) cleaning treatment and/or absorption of deposition gases (e.g., such as during formation and/or treatment of contact 195, contact surface 290, interconnect 180, and/or interconnect surface 280), can be reduced to a dielectric constant of approximately 2.7 during exposure to the first ambient of gas.

According to embodiments, exposure of conductors such as contact 195 and interconnect 180 to first ambient of gas 240 during treatment of surfaces 130 under such first ambient exposure conditions described above has a minimal effect on those conductors and their surfaces. For example, such first ambient exposure conditions as described above are controlled to terminate prior to damage of conductors or their surfaces, such as by terminating exposure or limiting exposure to an appropriate first ambient of gas concentration, temperature, time, and pressure that minimize damage to the conductors and surfaces, as well as minimize or prevent hillocks from forming on conductor surfaces (e.g., such as at contact surface 290 and interconnect surface 280).

Figure 3:
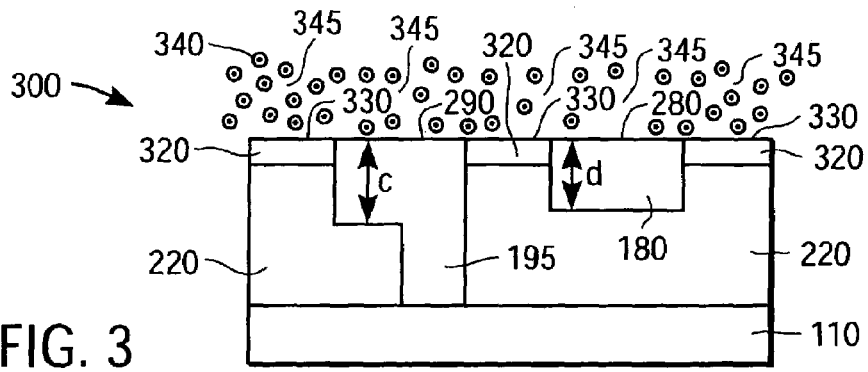
FIG. 3 shows the structure of FIG. 2 during exposure to a radio frequency stimulus in the presence of a second ambient of gas.

Thus, to the above process increases porosity of an interlayer dielectric material by driving away moisture or other constituents. In addition, according to embodiments, a structure including a surface-exposed dielectric layer may be processed (e.g., such as, processed in addition to and after the above process) to inhibit introduction of moisture or other constituents that could tend to decrease the porosity of the dielectric material. FIG. 3 shows the structure of FIG. 2 during exposure to a radio frequency (RF) stimulus in the presence of a second ambient of gas. Subsequent to treatment of dielectric material 120 by exposure to first ambient of gas 240, dielectric material 220 is then exposed to radio frequency stimulus 345 of sufficient power and in the presence of sufficient second ambient of gas 340 to densify a thickness of layer of dielectric material 220. As shown in FIG. 3, dielectric material 220 is exposed to radio frequency stimulus 345 in the presence of second ambient 340 to densify thickness 320, and continuing to densify material 220 under second ambient exposure conditions until thickness 320 has the desired thickness or density results. For example, thickness 320 may be densified to a density and/or thickness (e.g., beginning at surfaces 330 and extending further into dielectric material 220) to reduce, impede, obstruct, slow, minimize or prevent absorption of water, water vapor, moisture, or undesired gas particles into thickness 320, as well as into dielectric material 220. A representative suitable thickness for thickness 320 is on the order of 50 to 1000 angstroms.

Moreover, such second ambient exposure conditions include exposure of dielectric material 220 to radio frequency stimulus 345 of sufficient power in the presence of second ambient of gas 340 to densify a thickness of dielectric material 220 to a density and thickness sufficient to reduce or slow absorption of a reactant gas by the thickness. For instance, such second ambient exposure conditions may include sufficient exposure to reduce, impede, obstruct, slow or prevent absorption by thickness 320 (e.g., and subsequently by the underlying dielectric material 220) of reactant gas particles, such as by obstructing against penetration of ammonia ($NH_3$), and/or silicon nitride ($SiN_4$), such as during the gas soak stabilization stage of etch stop formation, to prevent pattern defects (e.g., of contact surface 290 and interconnect surface 280) and prevent increase in the dielectric constant (e.g., of thickness 320, as well as dielectric material 220). In addition, according to embodiments, second ambient of gas 340 may include an inert gas, such as described above with respect to first ambient of gas 240; and/or a carbon containing gas, such as described above with respect to first ambient of gas 240.

According to embodiments, suitable second ambient exposure conditions for exposing layer of dielectric material 220 to radio frequency stimulus 345 in the presence of a second ambient of gas include exposure to a RF stimulus having radio frequency stimulus power in a range between 100 watts and 5 kilo-watts total power, for a time in the range between 0.5 seconds and five minutes, at a pressure in the range between 0 Torr and 10 Torr, and at a temperature in a range between 250 degrees Celsius and 500 degrees Celsius. Moreover, appropriate second ambient exposure conditions may include combinations of various other appropriate RF stimulus frequencies and total exposure power, exposure times, exposure pressure, exposure temperatures, as necessary to provide the desired densification and/or densified thicknesses of thickness 320. For instance, second ambient exposure conditions may include exposing dielectric material 220 of CDO to a radio frequency stimulus having a total power of 600 watts, in the presence of second ambient of gas 340 of helium, at a pressure of 2 Torr, for eight seconds. As a result, a thickness of a porous dielectric material of CDO may be densified to reduce, impede, or prevent absorption by the thickness of water, water vapor, moisture, and/or reactant gas particles.

Moreover, according to embodiments, second ambient of gas 340 may be the same gas as or have the same gas makeup as first ambient of gas 240. In addition, according to embodiments, first ambient exposure conditions described above with respect to exposing layer of dielectric material 120 to first ambient of gas 240 may be repeated during a second ambient exposure conditions for subsequently exposure of dielectric material 220 to radio frequency stimulus 345 in the presence of second ambient of gas 340.

Conversely, according to embodiments, dielectric material 120 may be exposed to radio frequency stimulus 345 of sufficient power and in the presence of sufficient second ambient of gas 340 to densify a thickness of layer of dielectric material 120 without subsequent exposure of dielectric material 120 to first ambient of gas 240. Thus, for example, the structure shown in FIG. 1 may be exposed to a radio frequency stimulus in the presence of a second ambient of gas (e.g., as described above with respect to exposure of dielectric material 220 to radio frequency stimulus 345 in the presence of second ambient of gas 340) independently (e.g., without exposure of surfaces 130, and corresponding surface of contact 195 and interconnect 180 to a first ambient of gas (e.g., such as first ambient of gas 240)).

Figure 4:
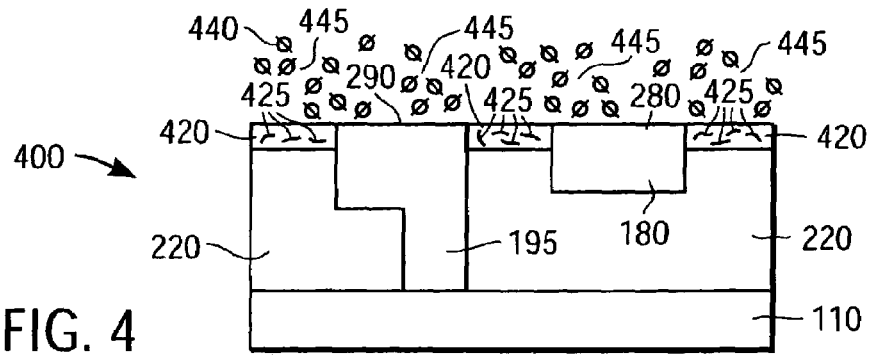
FIG. 4 shows the structure of FIG. 2 during exposure to a radio frequency stimulus in the presence of a second ambient of gas, to form a thickness of chemically densified bridge atoms.

FIG. 4 shows the structure of FIG. 2 during exposure to a radio frequency stimulus in the presence of a second ambient of gas, to form chemically densified bridge atoms. As shown, layer of dielectric material 220 is exposed to carbon containing gas 440 and radio frequency stimulus 445 to form plurality of chemically densified bridge atoms 425. Thus, embodiments include second ambient exposure conditions selected to cause carbon containing gas 440 to chemically densify thickness 420 of dielectric material 220 by bridging atoms 425 within the pores of thickness 420. Particularly, under the appropriate exposure conditions, carbon containing gas 440 will cause the breaking and forming of atomic bonds within the pores of dielectric material 220. Suitable gases for carbon containing gases 440 include those described above with respect to first ambient of gas 240.

Figure 5:
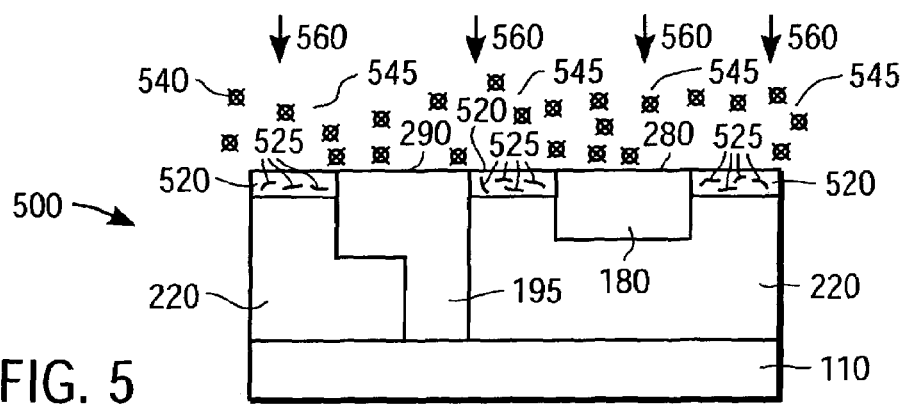
FIG. 5 shows the structure of FIG. 2 during exposure to a radio frequency stimulus in the presence of a second ambient of gas, to form a thickness of mechanically densified pores.

FIG. 5 shows the structure of FIG. 2 during exposure to a radio frequency stimulus in the presence of a second ambient of gas, to form mechanically densified pores. Layer of dielectric material 220 is exposed to heat 560 in the presence of inert gas 540 and radio frequency stimulus 545 to form plurality of chemically densified bridge atoms 525. Hence, embodiments allow for second ambient exposure conditions selected to cause inert gas 540 to chemically densify thickness 520 of dielectric material 220 by bridging atoms 525 within the pores of thickness 520. Suitable gases for inert gas 540 include those described above with respect to first ambient of gas 240. According to embodiments, mechanically densified collapsed pores may result from exposing densified pores in the presence of inert gas 540 to heat 560 of a temperature in the range of, between 250 degrees Celsius and 500 degrees Celsius, although other appropriate temperatures for collapsing pores are also contemplated.

According to embodiments, exposure of conductors such as contact 195 and interconnect 180 to second ambient of gas 540 and RF stimulus 345 during treatment of surfaces 330 under such second ambient exposure conditions described above has a minimal effect on those conductors and their surfaces. For example, such second ambient exposure conditions are controlled to terminate prior to damage of conductors or their surface, such as by terminating or limiting exposure to an appropriate second ambient of gas concentration, RF stimulus, RF power, temperature, time, and pressure that minimize damage to the conductors and surfaces and/or prevent or minimize formation of hillocks on conductors surfaces (e.g., such as at contact surface 290 and interconnect surface 280).

Figure 6:
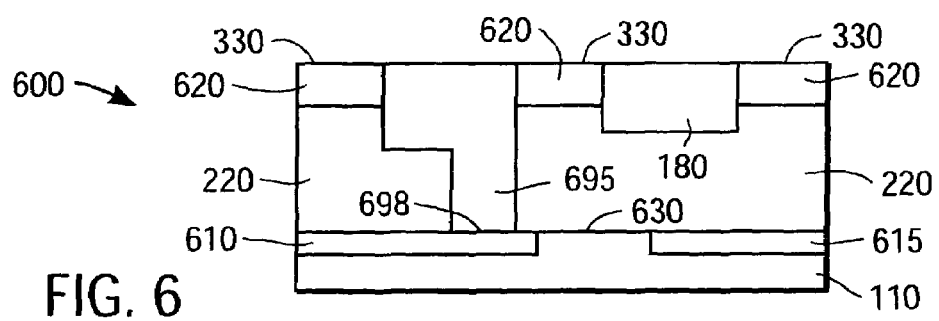
FIG. 6 shows the structure of FIG. 3 following the densification of a thickness of pores and shows a contact coupled to a device in the substrate.

FIG. 6 shows the structure of FIG. 3 following the densification of pores and shows a contact coupled to one of a plurality of devices in the substrate (e.g., see description of "devices" above with respect to contact 195 of FIG. 1). As shown in FIG. 6, substrate 110 comprises a plurality of devices, such as first device 610 and second device 615. FIG. 6 also shows first dielectric material 220 (e.g., such as dielectric material 220 of FIGS. 3–5 resulting from dielectric material 120 having been exposed to first ambient of gas 240, under first ambient exposure conditions, as described above with respect to FIG. 2) having first surface 330 and second surface 630 on substrate 110. Contact 695 is disposed between first surface 330 and second surface 630 and coupled at coupling point 698 to first device 610. In addition, FIG. 6 shows densified layer of dielectric material 620 (e.g., such as thickness 320, 420, and/or 520) superjacent to or formed from first dielectric material 220. Densified layer of dielectric material 620 may be formed such as by exposing dielectric material 220 to radio frequency stimulus (e.g., such as radio frequency stimulus 345, 445, and/or 545) in the presence of a second ambient of gas (e.g., such as ambient of gas 340, 440, and/or 540) according to second ambient exposure conditions as described above with respect to FIGS. 3–5.

Thus, dielectric material 220 and densified layer 620 may be any suitable dielectric material, or densified dielectric material, as described above, with respect to suitable materials described above for dielectric material 120. As a result, dielectric material 220 may comprise pores having residual particles or residue in them of any of the following: water; liquid; moisture; carbon containing gases, as described above with respect to first ambient of gas 240; inert gases as described above with respect to first ambient of gas 240; reactant gas particles as described above; and oxygen ($O_2$). In addition, densified layer 620 may comprise a plurality of bridged atoms 425, a plurality of collapsed pores 525, and/or other appropriately densified atoms resulting from exposure to a second ambient gas under second ambient exposure conditions as described above. For example, densified layer 620 may comprise a density and thickness to reduce, impede, obstruct, slow or prevent absorption of water, water vapor, moisture, and/or gas particles by densified layer 620, as well as by dielectric material 220.

Figure 7:
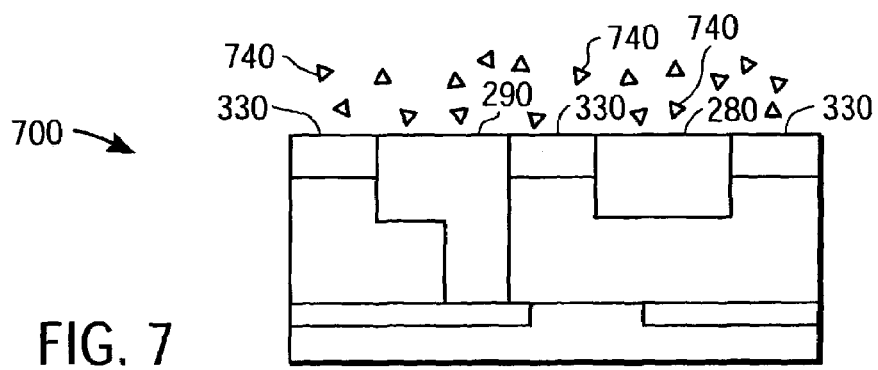
FIG. 7 shows the structure of FIG. 6 during exposure to an etch stop reactant gas.

FIG. 7 shows the structure of FIG. 6 during exposure to an etch stop reactant gas. FIG. 7 shows first surfaces 330, contact surface 290, and interconnect surface 280 exposed to etch stop reactant gas 740. According to embodiments, for example, surfaces 330, 280 and 290 may be exposed to a suitable reactant gas as part of an etch stop formation process. For instance, suitable reactant gases include, but are not limited to, ammonia ($NH_3$), saline ($SiH_4$), nitrous oxide ($N_2O$), and a silicon carbide (SiC) containing gas. Exposure of surfaces 330, 280 and 290 to reactant gas 740 may occur to pretreat the surfaces prior to subsequent formation of an etch stop material on the surfaces, such as to provide for better bonding of the etch stop material to the surfaces.

Figure 8:
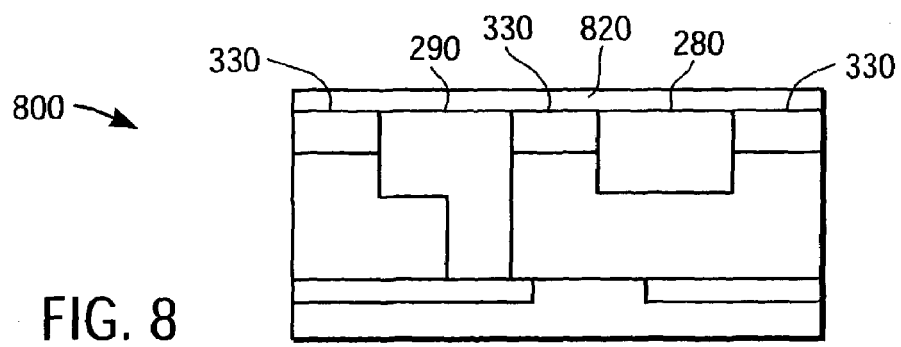
FIG. 8 shows the structure of FIG. 7 following the formation of an etch stop layer.

FIG. 8 shows the structure of FIG. 7 following the formation of an etch stop layer. FIG. 8 shows etch stop layer 820 formed over first surfaces 330, contact surface 290, and interconnect surface 280. Various appropriate thicknesses for etch stop layer 820 are contemplated, including thicknesses suitable for various technologies of IC fabrication. Etch stop layer 820 may be formed of one or more suitable materials, including silicon dioxide ($SiO_2$), silicon nitride ($SiN_4$), phosphosilicate glass (PSG), silicon carbide (SiC), fluorinated silicate glass (FSG), silicon oxynitride (SiON), or other appropriate etch stop materials.

Figure 9:
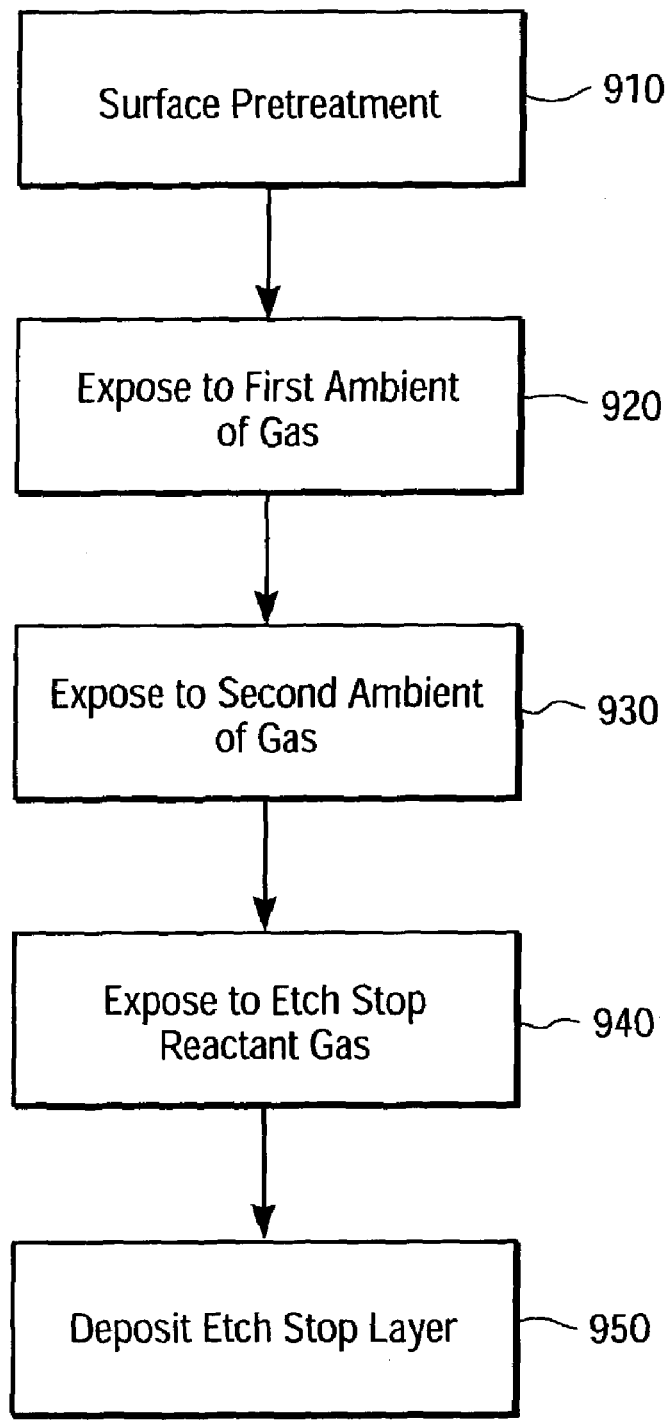
FIG. 9 is a flow diagram for exposing the surface of a layer of dielectric material on a substrate to a first and second ambient of gas prior to etch stop formation.

FIG. 9 is a flow diagram for exposing the surface of a layer of dielectric material on a substrate to a first and second ambient of gas prior to etch stop formation. Surface pretreatment block 910 describes processing of conductor surfaces (e.g., such as contact surface 290 and/or interconnect surface 280), such as by chemical vapor deposition (CVD), physical vapor deposition (PVD), conductor cleaning treatment, and conductor activation (e.g., such as by conductor doping).

Block 920 describes exposure of a layer of dielectric material (e.g., such as suitable dielectric materials described above with respect to dielectric material 120) to a first ambient of gas (e.g., such as an ambient of gas as described above with respect to first ambient of gas 240). Block 920 includes exposure or treatment of the dielectric material under first ambient exposure conditions as described above with respect to FIG. 2, as well as exposure or treatment of the dielectric material to a suitable inert gas soak to reduce the amount of moisture in the pores of the dielectric material.

Block 930 describes exposure of dielectric material (e.g., such as suitable dielectric materials described above with respect to dielectric material 120) to a second ambient of gas (e.g., such as described above with respect to second ambient of gas 340, 440, and/or 540). Block 930 includes second ambient exposure conditions as described above with respect to FIGS. 3–5, as well as exposure to any copper compatible gas (e.g., non-oxidizing gases) appropriate for densifying a portion of the porous dielectric.

In addition, according to embodiments, blocks 920 and 930 may be performed in the same or different chambers (e.g., such as IC fabrication chambers), by exposure to the same or different ambients of gas, by exposure to the same or different gas molecular makeups, and/or under the same or different ambient exposure conditions (e.g., such as any of the first and second ambient exposure conditions, as described above with respect to FIGS. 2–5).

For example, a layer of dielectric material (e.g., dielectric material 120) may be formed having a surface (e.g., surface 130) on a semiconductor substrate (e.g., substrate 110). Then, a porosity of a portion of the layer of dielectric material may be modified. Such modification can include modifying the surface of the material (e.g., surface 330) by exposing the layer of dielectric material (e.g., dielectric material 120) to a sufficient temperature (e.g., temperature 260) in the presence of a first ambient of gas (e.g., first ambient of gas 240) to drive or evaporate a plurality of water, water vapor, or moisture particles (e.g., particles 250) out of the dielectric material (e.g., particles 255) and lower the material's dielectric constant (e.g., to form dielectric material 220). Such modification may also include exposing layer of lowered dielectric constant dielectric material (e.g., dielectric material 220) to a radio frequency stimulus of sufficient power (e.g., stimulus 345, 445, and/or 545) in the presence of a second ambient of gas (e.g., second ambient of gas 340, 440, and/or 540) to densify a thickness (e.g., thickness 320, 420, and/or 520 or layer 620) of the layer of dielectric material.

Furthermore, according to embodiments, prior to the exposure or presence of the second ambient of gas, the layer of dielectric material (e.g., dielectric material 220) is exposed to either a vacuum or an ambient of gas that is the same gas or is a gas having the same molecular makeup as the first ambient of gas (e.g., gas 240). Thus, whether or not blocks 920 and 930 occur in the same or different chamber, by exposure to the same or different ambient of gas, by exposure to the same or different gas molecular makeup, and/or under the same or different ambient exposure conditions (e.g., as described above with respect to first and second ambient exposure conditions of FIGS. 2–5).

Also, according to an embodiment, once block 920 is complete, the dielectric material (e.g., dielectric material 220) should only be exposed to an amount of water, water vapor, or moisture particles (e.g., including liquid or gas), prior to block 930 that will keep the dielectric constant of the dielectric material (e.g., dielectric material 220) below a desired level due to the potential absorption of the water, water vapor, or moisture. For example, thickness 320 or layer 620 may be any suitable thickness and/or densification required to slow, impede, reduce or prohibit absorption of water, water vapor, or moisture particles by dielectric material 220, thickness 320 or layer 620 prior to or during any subsequent processing or manufacturing operations of semiconductor substrate 110 or an integrated circuit on which dielectric material 220 exists. Moreover, in embodiments, thickness 320 or layer 620 may be any suitable thickness and/or densification necessary to reduce, impede, or slow absorption of reactant gas particles by dielectric material 220, thickness 320 or layer 620 prior to or during any subsequent processing or manufacturing operations of semiconductor substrate 110 or an integrated circuit on which dielectric material 220 exists.

Specifically, for example, thickness 320 or layer 620 may be a thickness in the range between 100 angstroms and approximately ten percent of the trench depth of a contact formed in dielectric material 220 or interconnect thickness. For example, suitable thicknesses of thickness 320 or layer 620 include thicknesses in a range between a minimal thickness sufficient to prohibit, impede, or slow absorption of water, water vapor, moisture, or gas particles as described above to a thickness of up to twenty percent of trench depth "c", as shown in FIG. 3 or interconnect depth "d", as shown in FIG. 3. Specifically, thickness 320 or layer 620 of approximately ten percent of trench depth "c" may provide a five percent increase in the effective dielectric constant of an ILD, or approximately a 0.1 effective dielectric constant increase due to formation of a densified thickness of a CDO layer.

Furthermore, according to embodiments, surface treatment (e.g., such as described above with respect to surface pretreatment block 910) of conductor surfaces (e.g., such as contact surface 290 or interconnect surface 280) may be performed after exposure of dielectric material to a second ambient of gas (e.g., such as described above with respect to block 930). Thus, for instance, dielectric material (e.g., dielectric material 220), densified thickness (e.g., thickness 320 or 620), and conductor surfaces (e.g., such as contact surface 290 and/or interconnect surface 280) may be treated, such as is described above with respect to block 910, in order to clean and/or activate conductor surfaces (e.g., such as contact surface 290 and/or interconnect surface 280).

At block 940, dielectric material (e.g., dielectric material 220) and densified thickness (e.g., thickness 320 or 620) may be exposed to etch stop reactant gas (e.g., such as gas 740), for example, as part of the etch stop formation process. Thus, once block 730 is completed, the surface (e.g., such as surfaces 330, 280 and 290 in any of structures described in FIGS. 2–6) may then be exposed to moisture or an etch stop reactant gas, such as ammonia ($NH_3$), silicon nitride ($SiN_4$), nitrous oxide ($N_2O$), and/or a silicon carbide (SiC) containing gas. Due to densification of the dielectric material as described in block 930, however, the absorption of the moisture or reactant gas into the dielectric material (e.g., dielectric material 220) and into the densified thickness (e.g., thickness 320, 420, 520 or 620) is minimized.

At block 950, etch stop layer material may be deposited onto the surface (e.g., such as surfaces 330, 280 and 290 shown in FIGS. 3–6) to form an etch stop layer (e.g., such as layer 820) over the dielectric surface (e.g., surface 330), contact surface (e.g., surface 290), and/or interconnect surface (e.g., surface 280). For example, as part of the etch stop formation process, once block 940 is completed an etch stop layer of material, such as silicon nitride ($Si_3N_4$), silicon dioxide ($SiO_2$), silicon oxynitride (SiON), a silicon carbide containing gas (SiC(N)), and/or cubic boron nitride (CBN), may be formed on the surface (e.g., such as surfaces 320, 280 and 290 described in FIGS. 2–6).

According to embodiments, the blocks of FIG. 9 may be performed after or as part of a dual damascene process, or hard mask pretreatment process during a single damascene process. Also, according to embodiments, it is possible to combine with blocks 920 and 930 a conductor cleaning treatment operation. Thus, a CVD or PVD copper cleaning treatment may be performed during block 930's densification treatment. Also considered are embodiments without subsequent etch stop formation (e.g., such as blocks 940 and 950, gas 740, or layer 820) because densified thickness 320 provides a sufficient barrier so that subsequent processing of the structure (e.g., structures 200, 300, 400, 500 and 600) or integrated circuit can be provided without the need to form an etch stop layer after block 930.

The invention is described with reference to specific embodiments thereof. It will, however, be evident that various modifications and changes may be made thereto without departing from the broader spirit and scope of the invention as set forth in the claims. The specification and drawings are, accordingly, to be regarded in an illustrative rather than a restrictive sense.

What is claimed is:

1. A method comprising:
    forming a layer of dielectric material on a semiconductor substrate, the dielectric material having a planar surface and a porosity defined by liquid water absorbed in pores of the dielectric material; and
    modifying the porosity of a portion of the layer of dielectric material including the planar surface;
    wherein modifying comprises introducing a carbon containing gas into a chamber containing the layer of dielectric material, and exposing the layer of dielectric material to a temperature sufficient to one of drive out and evaporate the liquid water from the layer of dielectric material, such that the dielectric material has a k value less than 2.8.

2. The method of claim 1, wherein the temperature is greater than 150 degrees Celsius.

3. The method of claim 1, wherein modifying further comprises introducing an inert gas into the chamber.

4. The method of claim 1, wherein the carbon containing gas comprises one of one of an alkyl, an alkylene, and carbon dioxide ($CO_2$).

5. The method of claim 1, wherein introducing comprises one of exposing the layer to the carbon containing gas for a time in the range of between 1 second and 5 minutes, exposing the layer to the carbon containing gas at a temperature between 250 degrees Celsius and 500 degrees Celsius, and exposing the layer to the carbon containing gas at a pressure in the range of between 5 mTorr and 10 mTorr.

6. The method of claim 1, wherein modifying comprises exposing the layer of dielectric material to a radio frequency stimulus of sufficient power in the presence of a second ambient of gas to densify a thickness of the layer of dielectric material to impede absorption of one of water, water vapor, and gas particles by the thickness.

7. The method of claim 6, wherein the radio frequency stimulus power is at least 50 watts power.

8. The method of claim 1, wherein modifying comprises exposing the layer of dielectric material to a radio frequency stimulus of sufficient power in the presence of a second ambient of gas to densify a thickness of the layer of dielectric material to impede absorption of reactant gas particles by the thickness.

9. The method of claim 8, wherein the carbon containing gas is a first carbon containing gas, and the second ambient of gas comprises one of a second carbon containing gas and an inert gas.

10. The method of claim 8, wherein the carbon containing gas is a first carbon containing gas, and exposing the layer of dielectric material to a radio frequency stimulus comprises forming a plurality of bridged atoms chemically densified by a second carbon containing gas.

11. The method of claim 10, wherein the second carbon containing gas comprises one of an alkyl, an alkylene, and carbon dioxide ($CO_2$).

12. The method of claim 8, wherein the exposing the layer of dielectric material to a radio frequency stimulus comprises forming a plurality of collapsed pours mechanically densified by heating the densified pours in the presence an inert gas.

13. The method of claim 12, wherein the inert gas comprises one of argon (Ar), nitrogen ($N_2$), helium (He).

14. The method of claim 8, wherein the exposing the layer of dielectric material to a radio frequency stimulus comprises one of exposing for a time in the range of between 0.5 seconds and 5 minutes, exposing at a pressure in the range of between 5 mTorr and 10 Torr, exposing to a radio frequency stimulus power between 100 Watts to 5 Kilo-Watts total power.

15. The method of claim 1, wherein the layer of dielectric material comprises one of a layer of carbon doped oxide (CDO), a layer of cubic boron nitride (CBN), a layer of silicon dioxide ($SiO_2$), a layer of phosphosilicate glass (PSG), a layer of silicon nitride ($Si_3N_4$), a layer of fluorinated silicate glass (FSG), and a layer of silicon carbide (SiC).

16. A method comprising:
forming a layer of porous dielectric material having a surface, on a semiconductor substrate;
modifying a porosity of a portion of the layer of porous dielectric material including the surface, wherein modifying comprises, in the same chamber:
exposing the layer of porous dielectric material to a first ambient of a gas at a sufficient temperature to drive a plurality of water particles out of the layer of dielectric material;
introducing a carbon containing gas at a radio frequency stimulus of sufficient power to densify a thickness of the layer of porous dielectric material.

17. The method of claim 16, wherein prior to introducing, the layer of porous dielectric material is only exposed to one of a vacuum and an ambient of gas that has the same molecular makeup as the first ambient of gas.

18. The method of claim 16, wherein the first ambient of gas is the same gas as the carbon containing gas.

19. The method of claim 16, wherein the porosity of the portion of the layer of porous dielectric material is dependent on an amount of liquid water absorbed in pores of the dielectric material and exposing the layer comprises evaporating the liquid water.

20. The method of claim 19, wherein evaporating the liquid water comprises evaporating the liquid water from the layer of dielectric material such that the dielectric material has a k value less than 2.8.

21. The method of claim 20 wherein the surface of the layer indudes a planar surface.

* * * * *

UNITED STATES PATENT AND TRADEMARK OFFICE
CERTIFICATE OF CORRECTION

PATENT NO. : 7,223,705 B2  Page 1 of 1
APPLICATION NO. : 10/429984
DATED : May 29, 2007
INVENTOR(S) : Sriram et al.

It is certified that error appears in the above-identified patent and that said Letters Patent is hereby corrected as shown below:

In column 10, at line 61, delete the second occurrence of "mTorr" and insert --Torr--.

Signed and Sealed this

Twenty-fifth Day of December, 2007

JON W. DUDAS
*Director of the United States Patent and Trademark Office*